United States Patent
Nahapetian et al.

(10) Patent No.: US 6,654,386 B2
(45) Date of Patent: Nov. 25, 2003

(54) METHOD, SYSTEM, AND APPARATUS FOR PROCESSING AIRCRAFT DATA FILES

(75) Inventors: Armen Nahapetian, Glendale, CA (US); Ghobad Karimi, Tarzana, CA (US)

(73) Assignee: Teledyne Technologies Incorporated, Los Angeles, CA (US)

( * ) Notice: Subject to any disclaimer, the term of this patent is extended or adjusted under 35 U.S.C. 154(b) by 0 days.

(21) Appl. No.: 10/128,800

(22) Filed: Apr. 24, 2002

(65) Prior Publication Data

US 2003/0202527 A1 Oct. 30, 2003

(51) Int. Cl.[7] .................................................. H04J 3/00

(52) U.S. Cl. ....................... 370/474; 370/265; 370/412; 370/470; 370/472; 370/473; 370/476; 710/30; 710/36; 711/171

(58) Field of Search ................................ 370/265, 412, 370/466, 470, 471, 472, 473, 476, 474, 465, 468, 477, 503, 506, 508, 509, 510, 512; 455/98, 103; 710/20, 30, 36, 43; 711/171, 172

(56) References Cited

U.S. PATENT DOCUMENTS

| | | | | |
|---|---|---|---|---|
| 4,955,066 A | | 9/1990 | Notenboom | 382/56 |
| 6,292,878 B1 | * | 9/2001 | Morioka et al. | 711/171 |
| 6,314,416 B1 | * | 11/2001 | Schiefele | 706/60 |
| 6,353,734 B1 | * | 3/2002 | Wright et al. | 455/98 |

* cited by examiner

Primary Examiner—Seema S. Rao
Assistant Examiner—Shick Hom
(74) Attorney, Agent, or Firm—Kirkpatrick & Lockhart LLP

(57) ABSTRACT

A method, system, and apparatus of processing a data file stored in a computer memory in digital form. The method including selecting a packet size that is a number of bits between one and a subframe size within an input file containing data stored in frames and subframes format, wherein the data file stored in a computer memory in digital form; separating the data into consecutive packets of the selected size; repositioning the packets located in similar positions within a frame adjacent to one another; and storing the packets in an output file for further processing by a compression algorithm. The system includes a processor for executing the method and a memory for storing an output data file. The apparatus including a computer readable medium having computer executable instructions thereon for executing the method.

33 Claims, 5 Drawing Sheets

METHOD, SYSTEM, AND APPARATUS FOR PROCESSING AIRCRAFT DATA FILES

BACKGROUND

The present invention is directed generally to reducing the storage space required for data files and, more particularly, to processing aircraft data files prior to compression and after decompression.

It is common for an aircraft to generate records of data relating to the aircraft. Such records of data relating to the aircraft may be used for analyzing the behavior of the aircraft during flight, for identifying potential problems with the aircraft, or for investigating causes of aircraft accidents and incidents. To fulfill these functions, significant amounts of digital data relating to the aircraft are recorded before, during, and after each flight. For example, there can be up to several hundred different parameters relating to the aircraft that are measured and recorded during flight. Some data typically relate to parameters such as: air speed, altitude, vertical acceleration, heading, time, pitch, rudder position, fluid pressures, temperatures, and other aircraft positions and control surface positions. Such data can relate to various flight and performance parameters associated with each flight and can include data that are useful for maintaining the aircraft in proper operation. Other data can be utilized, for example, for investigating accidents or near-accidents and for assisting in detecting faulty components or gradual deterioration of systems or components, for assisting in reviewing crew performance, and for assisting in logistical planning activities such as scheduling and routing.

A digital flight data acquisition unit (DFDAU) may be used to gather data relating to an aircraft. The DFDAU may store the data on storage media such as magnetic media, optical media, magneto-optical media, or personal computer memory cards (PCMCIA cards). When the aircraft lands, the data relating to the aircraft may be provided to a flight operations center (FOC) by physically removing the storage media and manually transporting it to the FOC. Otherwise the data can be transmitted to the FOC using radio frequency (RF) transmissions. It is also known to transmit the data via a telephone system located in a terminal. Furthermore, the aircraft data can be transferred using transmission systems that automatically transfer the aircraft data from the aircraft to the FOC, and vice-versa, using little or no human involvement and which rely on wireless delivery systems, such as wireless cellular technology, for example.

The recordation of data relating to an aircraft for the purposes of investigation, maintenance, and flight operations is often done in a repetitive format using aviation industry standard formats known as subframes and frames. Once recorded, the data are sometimes compressed using conventional digital data compression techniques. Such conventional compression techniques, however, do not benefit from the specific nature of the aircraft data and therefore do not optimize the file compression ratios that could be achieved by taking into account the form in which the aircraft data is stored in the storage media. Alternatively, formats other than the industry standard subframe/frame formats can sometimes be used for recording and compressing the aircraft data in view of the specific nature of the aircraft data. In the latter case, however, interpreting the data becomes more difficult because the recordation of the aircraft data is not stored in accordance with the industry standard. Accordingly, conventional digital data compression techniques do not provide the most efficient aircraft data compression ratios and, thus, do not optimize the storage available on the storage media aboard the aircraft.

Storing digital aircraft data in a minimum space is frequently desired because compressed data generally require less storage space and takes less time to communicate between an aircraft and a FOC. Furthermore, less communication time saves money because it reduces the connection fees for each set of aircraft data communicated. It is also desirable to communicate the aircraft data in the quickest time possible because only a short period may be available in which the aircraft data can be communicated. For example, aircraft data may not be transmitted while the aircraft is still in flight to avoid interfering with the operation of on-board avionic systems, radios, and the like, during flight. Accordingly, aircraft data may be transmitted as soon as the aircraft lands. In some cases, the aircraft data must be communicated during a limited time period of about 20 minutes, for example, while the aircraft remains on the ground, while the aircraft doors remain open, or while power is applied to the aircraft.

Although there is a need to maximize the compression of aircraft data, there is a limit to the file compression ratio or reduction ratio that a file compression software program can achieve. Factors limiting the file compression ratio include, for example, the file type, the file size, and the compression scheme used by the compression algorithm. Furthermore, files that contain a lot of unique information generally do not compress well. Alternatively, files that contain a lot of repeated information such as characters or patterns of characters generally compress very well. Moreover, the overall rate of compression increases with the file size in files that contain a lot of repeated information. The problem with conventional file compression programs is that they have no a priori knowledge of the contents of the data file to be compressed. Also, conventional file compression programs do not rearrange the sequence of characters contained in the data file. Rather, the conventional compression programs utilize algorithms that merely parse the data file looking for repeated patterns and create a reference dictionary for cataloging the various redundant pieces of data.

SUMMARY

According to one aspect the invention provides a method of processing a data file, including: selecting a packet size that is a number of bits between one and a subframe size within an input file containing data stored in frames and subframes format, wherein the data file is stored in a computer memory in digital form; separating the data into consecutive packets of the selected size; repositioning the packets located in similar positions within a frame adjacent to one another; and storing the packets in an output file.

Another aspect of the invention provides a method of processing a compressed data file, including: decompressing a compressed data file stored in a computer memory in digital form, the compressed data file containing a predetermined packet size, repositioned packets located in similar positions within a frame adjacent to one another, and separated consecutive packets of the predetermined packet size, wherein the predetermined packet size is between one and a subframe size; repositioning the adjacent consecutive packets of the predetermined size into an original position within the frame; and storing the decompressed repositioned frames in an output file.

A further aspect of the invention provides a method of processing a data file, including: (a) selecting a number of frames to be processed within an input file containing data stored in frames and subframes format, wherein the data file is stored in a computer memory in digital form, and wherein the number of frames are selected according to an available amount of memory in the computer; (b) creating an output file to store the processed data; (c) selecting a packet size that is a number of bits between one and a subframe size; (d) separating the data into consecutive packets of the selected size; (e) repositioning the packets located in similar positions within a frame adjacent to one another; (f) appending the processed packets to the output file; (g) repeating (c)–(f) for the number of selected frames; (h) processing a remaining portion of the input file containing less than the selected number of frames; and (i) storing the output file for further processing by a compression algorithm.

Yet another aspect of the invention provides a method of processing a compressed data file, including: (a) decompressing the compressed data file stored in a computer memory in digital form, the compressed data file containing groups of frames chosen by selecting a number of frames to be processed within an input file containing data stored in frames and subframes format, wherein the data file is stored in a computer memory in digital form, and wherein the number of frames are selected according to an available amount of memory in the computer, a predetermined packet size identifier, repositioned packets located in similar positions within a frame of a selection adjacent to one another, and separated consecutive packets of the predetermined packet size, wherein the predetermined packet size is a number of bits between one and a subframe size; (b) repositioning the adjacent consecutive packets of the predetermined size into an original position within the frame; (c) storing the repositioned frames in the output file; (d) repeating (b)–(c) until all selections of the decompressed file are processed; and (e) repeating (b)–(c) for the last selection of the decompressed file of less than the selected size.

Yet a further aspect of the invention provides a system for processing a data file, including: a processor for selecting a packet size that is a number of bits between one and a subframe size within the input file containing data stored in frames and subframes format, wherein the data file is stored in a computer memory in digital form; separating the data into consecutive packets of the selected size; and repositioning the packets located in similar positions within a frame adjacent to one another; and a memory for storing the packets in an output file for further processing by a compression algorithm.

Still another aspect of the invention provides a system for processing a compressed data file, including: a processor for decompressing the compressed data file stored in a computer memory in digital form, the compressed data file containing a predetermined packet size identifier, repositioned packets located in similar positions within a frame adjacent to one another, and separated consecutive packets of the predetermined packet size, wherein the predetermined packet size is between one and a subframe size; repositioning the adjacent consecutive packets of the predetermined size into an original position within the frame; and a memory for storing the decompressed repositioned frames in an output file.

Still a further aspect of the invention provides a system for processing a data file stored in a computer memory in digital form, including: a processor for: (a) selecting a number of frames to be processed within an input file containing data stored in frames and subframes format, wherein the data file is stored in a computer memory in digital form, and wherein the number of frames is selected according to an available amount of memory in the computer; (b) creating an output file to store the processed data; (c) selecting a packet size that is a number of bits between one and a subframe size; (d) separating the data into consecutive packets of the selected size; (e) repositioning the packets located in similar positions within a frame adjacent to one another; (f) appending the processed packets to the output file; (g) repeating (c)–(f) for the number of selected frames; and (h) processing a remaining portion of the input file containing less than the selected number of frames; and a memory for storing the output file for further processing by a compression algorithm.

Another aspect of the invention provides a system for processing a data file stored in a computer memory in digital form, including: a processor for: (a) decompressing a compressed data file stored in a computer memory in digital form, the compressed data file containing groups of frames chosen by selecting a number of frames to be processed within an input file containing data stored in frames and subframes format, wherein the data file is stored in a computer memory in digital form, and wherein the number of frames is selected according to an available amount of memory in the computer a predetermined packet size identifier, repositioned packets located in similar positions within a frame adjacent to one another, and separated consecutive packets of the predetermined packet size, wherein the predetermined packet size is a number of bits between one and a subframe size; (b) repositioning the adjacent consecutive packets of the predetermined size into its original position within the frame; (c) storing the repositioned frames in the output file; (d) repeating (b)–(c) until all selections of the decompressed file are processed; and (e) repeating (b)–(c) for the last selection of the decompressed file of less than the selected size.

A further aspect of the invention provides a computer-readable medium including computer executable instructions thereon for: selecting a packet size that is a number of bits between one and a subframe size within an input file containing data stored in frames and subframes format, wherein the data file is stored in a computer memory in digital form; separating the data into consecutive packets of the selected size; repositioning the packets located in similar positions within a frame adjacent to one another; and storing the packets in an output file for further processing by a compression algorithm.

Yet another aspect of the invention provides a computer-readable medium including computer executable instructions thereon for: decompressing a compressed data file stored in a computer memory in digital form, the compressed data file containing a predetermined packet size identifier, repositioned packets located in similar positions within a frame adjacent to one another, and separated consecutive packets of the predetermined packet size, wherein the predetermined packet size is a number of bits between one and a subframe size; repositioning the adjacent consecutive packets of the predetermined size into its original position within the frame; and storing the decompressed repositioned frames in an output file.

Yet a further aspect of the invention provides a computer-readable medium comprising computer executable instructions thereon for: (a) selecting a number of frames to be processed within an input file containing data stored in frames and subframes format, wherein the data file is stored in a computer memory in digital form, and wherein the number of frames is selected according to an available amount of memory in the computer; (b) creating an output file to store the processed data; (c) selecting a packet size that is a number of bits between one and a subframe size; (d) separating the data into consecutive packets of the selected size; (e) repositioning the packets located in similar positions within a frame adjacent to one another; (f) appending the processed packets to the output file; (g) repeating (c)–(f) for the number of selected frames; (h) processing a remaining portion of the input file containing less than the selected number of frames; and (i) storing the output file for further processing by a compression algorithm.

Still another aspect of the invention provides a computer-readable medium including computer executable instructions thereon for: (a) decompressing a compressed data file stored in a computer memory in digital form, the compressed data file containing a predetermined packet size identifier, repositioned packets located in similar positions within a frame adjacent to one another, and separated consecutive packets of the predetermined packet size, wherein the predetermined packet size is a number of bits between one and a subframe size; (b) repositioning the adjacent consecutive packets of the predetermined size into an original position within the frame; (c) storing the repositioned frames in the output file; (d) repeating (b)–(c) until all portions of the compressed file are processed; and (e) repeating (b)–(c) for the last selection of the decompressed file of less than the selected size.

BRIEF DESCRIPTION OF THE DRAWINGS

In the accompanying drawings, wherein like numerals represent like elements.

DESCRIPTION

Figure 1:
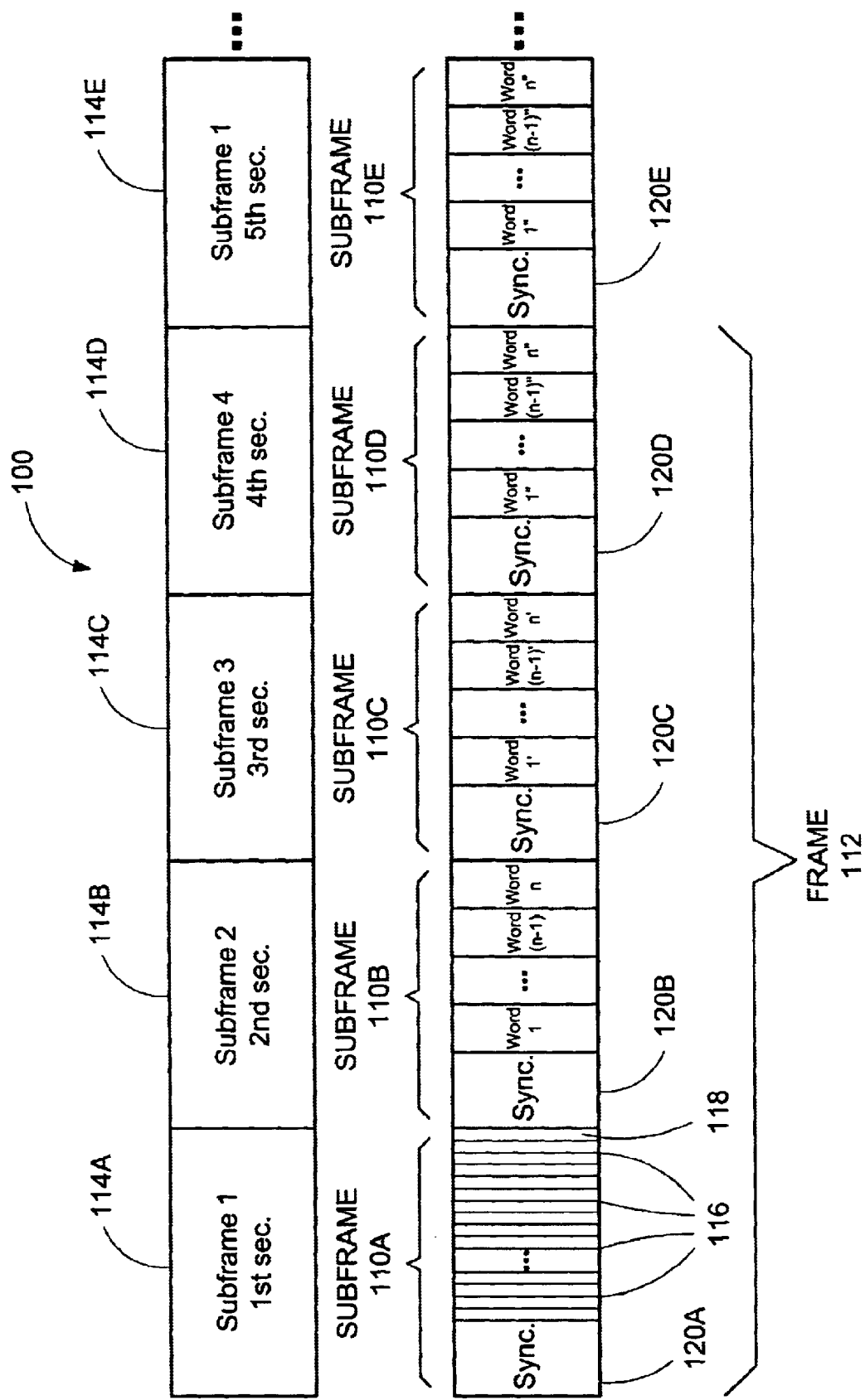
FIG. 1 illustrates one embodiment of an aircraft data subframe/frame data format.

The embodiments of the invention described herein are implemented as an apparatus, system, and method for processing data. Although the embodiments are described with respect to aircraft data, the scope of the present invention is not to be limited to aircraft data as it can be applied to any data type. Accordingly, one embodiment of the present invention provides an apparatus, system, and method for processing data relating to an aircraft (aircraft data) before compressing the aircraft data using any file compression program. In one embodiment, the present invention pre-processes aircraft data that are stored in avionics standard practice subframe/frame packet format. Processing the data before compressing the data (pre-processing) increases the overall compression ratio and thus makes the storage and communication of the data more efficient and economical. Further, one embodiment of the present invention provides an apparatus, system, and method for processing the data after decompressing the compressed data using any decompression program and restoring the aircraft data to its original pre-pre-processing format.

Once the aircraft data are pre-processed for compression, any file compression program may be used to compress the pre-processed aircraft data, including compression programs such as, for example, PKZIP®, WINZIP®, STUFFIT®, and other similar related file compression programs. In one embodiment, the present invention operates in conjunction with any file compression programs that use redundancy in the data contained in a data file to reduce the amount of memory or storage space required to store the data file. Some compression programs are able to reduce the data file size by replacing redundant data with symbols that merely refer to the data that appear repeatedly within the data file. Conventional compression programs create reference tables, commonly known as dictionaries, to store the symbolic reference information.

Although one embodiment of the present invention operates with most conventional file compression programs that use one or more variations of the Huffman compression technique or the Lempel-ZIV (LZ) adaptive dictionary-based algorithm, those skilled in the art will appreciate that the present invention is not limited thereto. Any file compression program that replaces redundant characters, words, patterns of characters, symbols, and other repetitive information contained in a data file can be used with the several embodiments of the present invention described herein without departing from the scope of the invention.

One embodiment of the present invention provides a method for rearranging the data to be compressed contained in a data file in order to increase the file compression ratio that can be achieved using file compression programs. The compression method in accordance with one embodiment of the invention has a priori knowledge of the contents of the data file to be compressed and the specific formatting arrangement of the contents of such data file.

Generally, aircraft data files containing a lot of repeated information can be pre-processed in order to rearrange the data contained therein prior to inputting the file into a compression algorithm. Accordingly, such pre-processed files can be compressed to much higher compression ratios than can be obtained by inputting the unprocessed aircraft data file into the compression algorithm alone. Also, as with unprocessed data files, the overall rate of compression of such pre-processed aircraft data files increase with the overall file size. The pre-processing method according to one embodiment of the present invention is able to achieve higher compression ratios because it has a priori knowledge of the contents of the aircraft data file to be compressed. For example, the pre-processing method has prior knowledge of the data formatting used in the aircraft data file and can therefore rearrange redundant data to achieve much higher compression ratios than can be achieved with conventional compression methods. Therefore, one embodiment of the present invention provides higher compression ratios by using a priori knowledge of the data formatting techniques used in avionics data acquisition systems. Accordingly, the method in accordance with the present invention can rearrange sequences of data contained in the aircraft and prepare the sequences of data for a compression algorithm. In contrast, conventional compression programs merely parse an aircraft data file looking for redundant patterns and create a reference dictionary for cataloging any redundant patterns within the data file.

Turning now to the figures, FIG. 1 illustrates one embodiment of an aircraft data subframe/frame data format 100 that may characterize the formatting of aircraft data to be utilized with one embodiment of the present invention. Accordingly, the method according to one embodiment of the present invention pre-processes any aircraft data that are recorded in the subframe/frame format 100 and provides a file output that can be compressed using a generic compression algorithm. As a result, the output of the compression algorithm yields a greater file compression ratio than would be possible without the pre-processing steps. Additionally it has been shown by experimentation that the time needed to compress pre-processed aircraft data is significantly lower than the time needed to compress aircraft data that is not pre-processed.

Some avionics standards recommend that raw aircraft data be recorded in such packets (subframes) 110A, B, C, D, E for example. In one embodiment, the subframe/frame data format 100 comprises four sub frames 110A, B, C, D for each frame 112 of aircraft information recorded. In one embodiment of the present invention a "frame" 112 is a sequence of four possibly different subframes 110A, B, C, D. In one embodiment, the present invention processes aircraft data files that contain data stored in the subframe/frame data format 100. In one embodiment, each subframe 110A, B, C, D, E represents data recorded over a subframe time interval 114A, B, C, D, E of one second, for example, and includes a fixed number of words 116 called the "subframe size" therein. For the frame 112, a subframe 110A, B, C, D may include 1, 2, 4, 8, 16, 32, 64, 128, 256, 384, 512, 1024, and 2048 words 116, for example. After the data is stored in the four subframes 114A, B, C, D, a new frame begins at the next time interval with subframe 114E, for example.

A word 116 has a predetermined "word size" corresponding to a fixed number of bits 118 comprising the word 116. For example, a word 116 may include 1, 2, 4, 8, 12, 16, and 32 bits 118. The first portion of a subframe does not contain aircraft parameter data, but rather includes a special bit pattern called the synchronization word 120A, B, C, D, E. The synchronization word 120A, B, C, D, E is used for identifying the beginning of a subframe 110A, B, C, D, E. In each frame 112, four unique synchronization word 120A, B, C, D patterns are used wherein each pattern identifies a unique subframe 110A, B, C, D. When a new frame is started, the same synchronization word pattern is repeated.

A word 116 contained in a subframe 110A, B, C, D, E may hold the value of one aircraft measurement parameter or a combination of parameters if such parameters can be accommodated within the word size. Furthermore, if the parameter requires more bits 118 than the current word size permits, the parameters can be split into two or more words 116. The position of a word 116 within the subframe 110A, B, C, D, E and the subframe sequence within a frame 112 (the description of "frames" follows hereinbelow) can be used to identify the contents of the word 116 and thus the parameters contained within the word 116.

To support parameters that have a slow rate of change and do not have to be recorded every second, the recording format also allows the recording of parameters at different subframe time intervals 114A, B, C, D, E greater than one second such as, for example, once every two seconds, once every four seconds, and other similar intervals. In one embodiment of the present invention, this can be done by using the same word 116 location for two different parameters, alternating the value every other second, or using the word 116 for four different parameters with each one recorded every fourth second, and so on. The latter formatting technique, for example, results in a minimum recording rate of one sample every four seconds. Regardless of how the recording format is altered by the method according to one embodiment of the present invention, each subframe 110A, B, C, D, E holds the same parameters as the subframe 110A, B, C, D, E recorded four seconds earlier. Because a frame 112 may be defined as a sequence of four possibly different subframes 110A, B, C, D, to distinguish the four different subframes 110A, B, C, D within the frame 112, a different synchronization word 120A, B, C, D is used for each subframe 110A, B, C, D.

Figure 2:
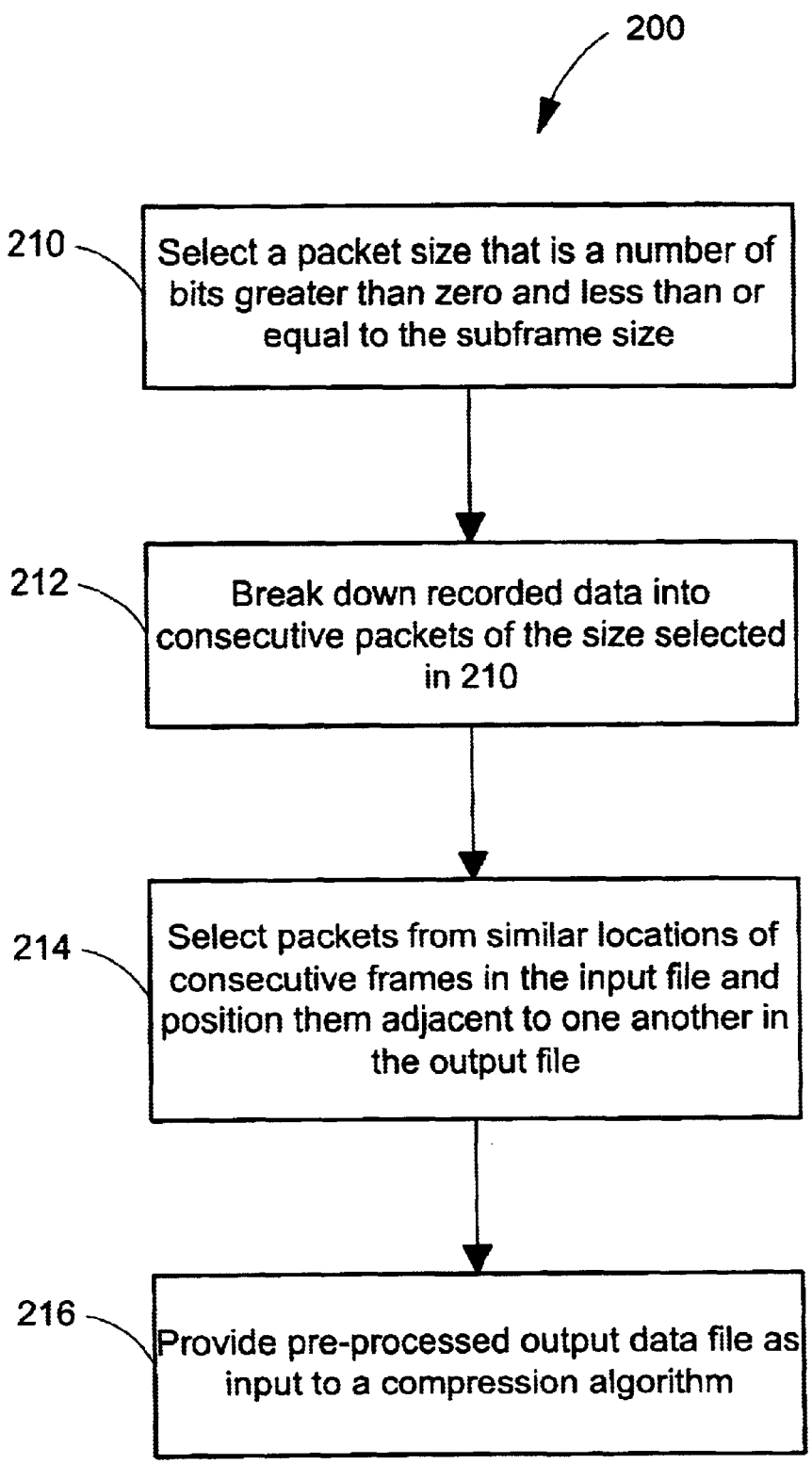
FIG. 2 illustrates a flow diagram in accordance with one embodiment of a method according to the present invention.

FIG. 2 illustrates a flow diagram 200 of a method in accordance with one embodiment of the present invention. At block 210, the process selects a packet size that is a number of bits greater than zero and less than or equal to the subframe size. In one embodiment of the present invention, a number such as 4 or 8 bits can be used for the packet size for computers that can access bytes in memory. At block 212, the recorded aircraft data are broken down or separated into consecutive packets of the size selected in block 210. At block 214, the recorded aircraft data that have yet to be processed are separated into the consecutive packets of the size selected in block 210. The separated consecutive packets are input into the pre-processing method according to one embodiment of the present invention. Data packets that are located in similar positions in consecutive frames 112 are selected from the input file and are positioned adjacent to one another in an output file referred to as a pre-processed aircraft data file. The repositioning can be done "physically" by moving the data in memory, or "logically" by moving pointers to the data. In any case, the net effect is that similar packets of the same aircraft parameter are moved into adjacent locations. For example, the more significant bits of all altitude recordings are grouped together, as are the less significant bits. This results in a larger number of similar patterns in close proximity. The pre-processed aircraft data file (e.g., the output file) is now ready to be input into any compression algorithm for compression. Accordingly, after executing the steps in blocks 210 to 214 in accordance with the flow diagram 200, at block 216, the output file is provided as the input to a compression algorithm. Accordingly, higher compression ratios are achieved than would be achieved if the aircraft data file had not been pre-processed.

Figure 3:
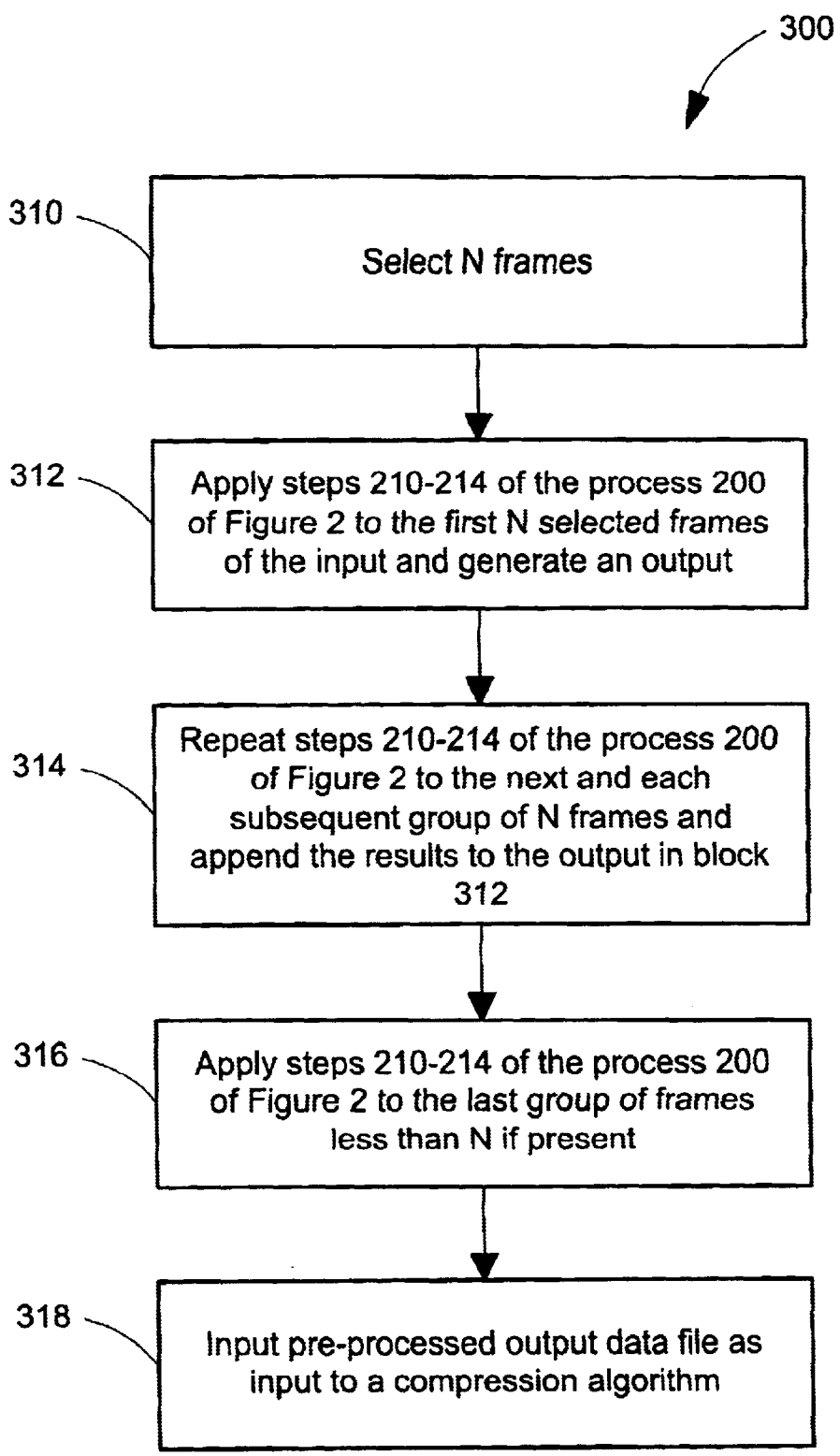
FIG. 3 illustrates a flow diagram in accordance with one embodiment of a method according to the present invention.

FIG. 3 illustrates a flow diagram 300 in accordance with one embodiment of the present invention that can be used, for example, where memory or storage space on the aircraft computers, data acquisition systems, or storage devices are limited. The flow diagram 300 is useful, for example, when not all the input subframes 110A, B, C, D and frames 112 can be accessed randomly so that the words 116 can be repositioned. Accordingly, at block 310, the method according to one embodiment of the present invention selects a number of frames 112, such as N, such that the steps 210 through 214 of the flow diagram 200 described in FIG. 2 can be applied to the selected N frames 112. At block 312, an algorithm implementing the steps 210 through 214 is executed for the first N frames 112 of the input file and generates an output file therefrom. At block 314, the steps 210 through 214 are applied to the next group of N frames 112 and each subsequent group of N frames, thereafter. The results are appended to the output file (the pre-processed file). At block 316, the last group of frames 112, which may include less than N frames 112, are processed to complete the algorithm. At block 318, the pre-processed output file is provided as an input file to a compression algorithm.

After applying the algorithms according to the flow diagrams 200, 300 illustrated in FIGS. 2 and 3, respectively, compression algorithms may be used to yield high compression ratios. Those skilled in the art will appreciate that a method implementing the reverse of the flow diagram 200 can be used after a compressed data file has been decompressed using decompression algorithms in order to reconstruct the frames and the subframes. For example, a data file that had previously been pre-processed and compressed with a compression algorithm is decompressed with a decompression algorithm. Packets that are positioned adjacent to one another in the decompressed file are placed in similar positions in consecutive frames in a file. Based on the packet size previously determined to be number of bits greater than zero and equal to or less than the subframe size, the original file is reconstructed. Furthermore, after decompressing the compressed files the reverse of the algorithm according to the flow diagram 300 can be applied to reconstruct each group of the N frames 112 with the corresponding embedded subframes 110A, B, C, D.

Accordingly, with reference to FIGS. 1–3, with knowledge and understanding of how aircraft data are arranged when recorded in subframe/frame format 100 the words 116 within the subframes 110A, B, C, D and bits within a word can be rearranged and grouped in such a manner as to increase the compression ratio of the data. One example is illustrated wherein the aircraft data parameter "altitude" is recorded and stored as a word 116 contained in the subframes 10A, B, C, D and is repeated in subsequent frames 112. Because an aircraft's altitude may not change for long durations of time, grouping multiple altitude parameters stored in multiple words 116, subframes 110A, B, C, D, and frames 112 will provide a better format for compression. The grouping can be further separated by dividing the words 116 into higher order bits and lower order bits and grouping the higher order bits that do not change over longer periods. For example, if the altitude is stored in a word 116 comprising 12 bits, the word can be separated into three distinct groups of four bits. All of the higher order four bits in the altitude parameter, for example, can now be rearranged and grouped in consecutive packets because once the aircraft reaches a steady altitude the higher order four bits are not likely to change. Hence, the rearrangement and pre-processing of similar words 116 will yield higher compression ratios when the aircraft data file is compressed using conventional compression algorithms. The same process is repeated for other aircraft parameters stored in the aircraft data file.

Figure 4:
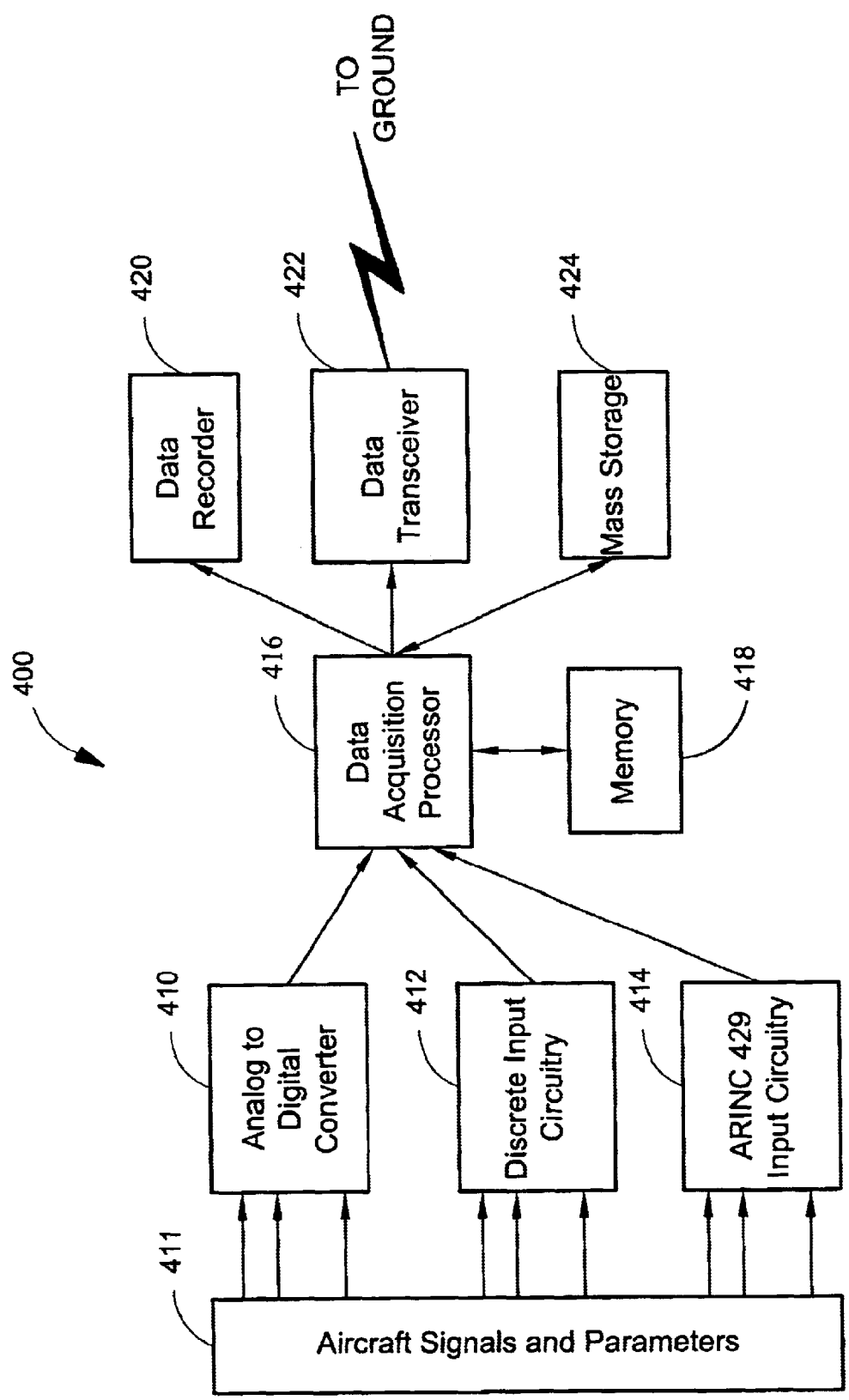
FIG. 4 illustrates a block diagram of a data acquisition system in which one embodiment of the present invention may be employed.

FIG. 4 illustrates one embodiment of a data acquisition system 400 in which one embodiment of the present invention may be employed. The data acquisition system 400 may be any data acquisition system. The embodiment depicted in FIG. 4, however, may be used as an aircraft data acquisition system wherein a plurality of aircraft signals and parameters 411 are provided as inputs to a variety of circuits 410, 412, 414. Such circuits include, but are not limited to, analog to digital converters 410, discrete input circuitry 412, and ARINC 429 input circuitry 414, for example. The circuits 410, 412, 414 are either connected to or in communication with a data acquisition processor 416 and a memory 418. In one embodiment, the memory 418 is in communication with the data acquisition processor 416. The aircraft signals and parameters 411 captured by the circuits 410, 412, 414 are provided as input data to the data acquisition processor 416 and in turn, the data acquisition processor 416 processes the input data and outputs processed data to a plurality of devices 420, 422, 424. For example, the data acquisition processor 416 may output the processed data to a data recorder 420 or a data transceiver 422 for transmitting and receiving data between an aircraft and a ground based station. Furthermore, the data acquisition processor 416 may output the processed data to a mass storage device 424.

In one embodiment of the present invention, the data corresponding with the aircraft signals and parameters 411 may be stored in a DFDAU processor in the form of an aircraft data file, for example. An application layer of an operating system of a gatelink processor may process the stored aircraft data file, for example. Those skilled in the art will appreciate that the operating system may be any type of suitable operating system such as, for example, UNIX. In one embodiment of the present invention, the application layer pre-processes the stored aircraft data file in accordance with the methods 200, 300 described herein with reference to FIGS. 2 and 3, respectively. The pre-processed data file then may be compressed using any compression algorithms, for example. After the data are processed they may be compressed, for example, from approximately 40 Mbytes to approximately 4 Mbytes or less. Compression may be done by any compression method such as, for example, the method embodied in the PKZIP® compression utility, manufactured by PKWARE, Inc., WINZIP®, STUFFIT®, and other similar and related compression programs. After compression the compressed data may be encrypted and segmented.

Figure 5:
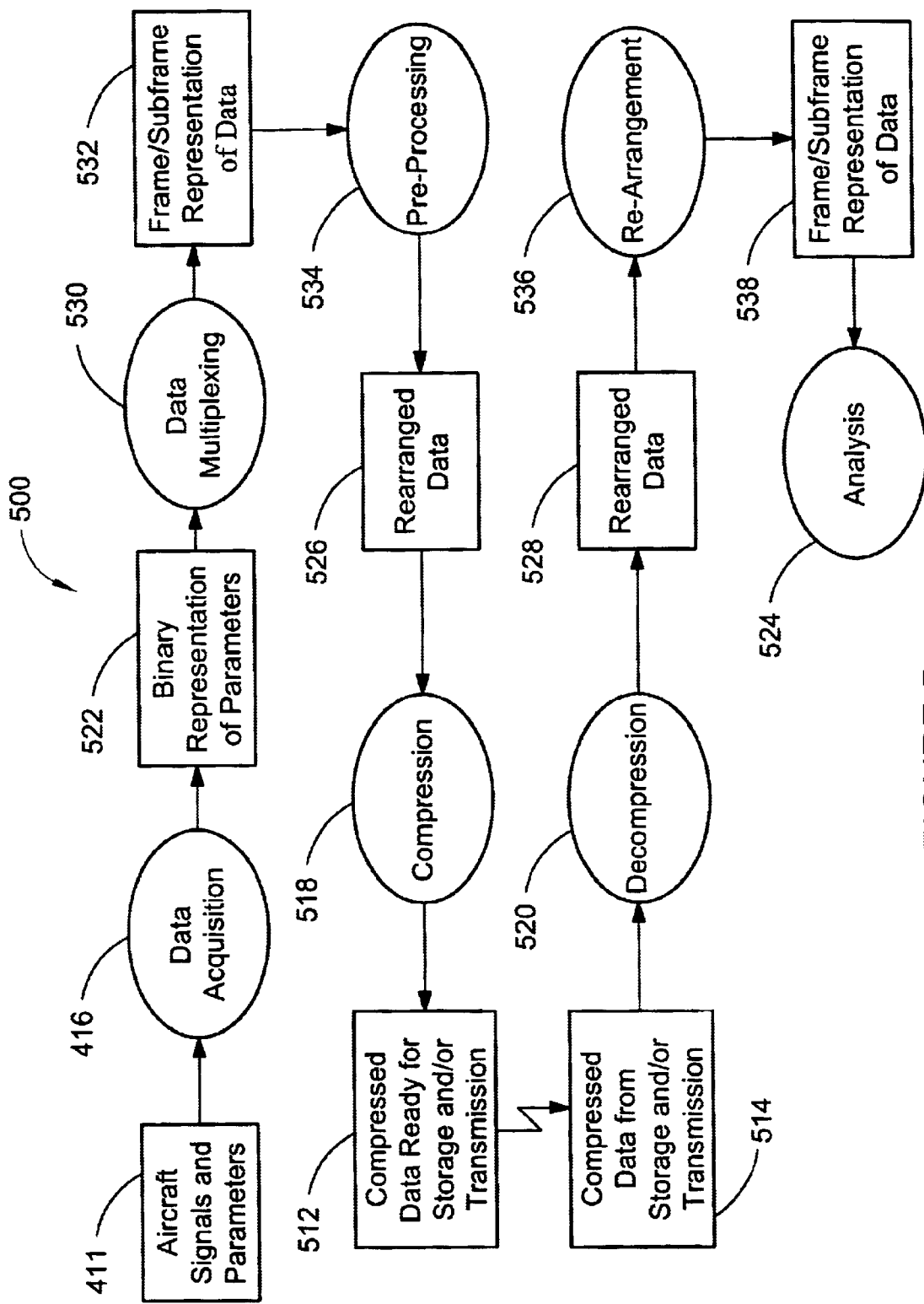
FIG. 5 illustrates a block diagram illustrating data flow through a data acquisition system in which one embodiment of the present invention may be employed.

FIG. 5 illustrates a block diagram 500 of data flow through the system 400 illustrated in FIG. 4, for example. The aircraft signals and parameters 411 are provided to the data acquisition processor 416 where they are processed into a binary representation of the parameters at block 522. From block 522, the binary representation of the aircraft signals and parameters 411 provided to a data multiplexing portion 530 of the system 500, and at block 532 they are arranged into a frame/subframe representation of the data. The frame/subframe representation of the data is then provided to block 534 for pre-processing so that the data may be pre-processed in accordance with one embodiment of the present invention. The pre-processed data is rearranged as block 526 and compressed at block 518 using any compression algorithm. The compressed data is then provided to a plurality of output circuits at block 512 wherein the compressed data is prepared for storage in the mass storage device 424, transmission/reception by the data transceiver 422, or recordation provided to the data recorder 420.

Once the compressed data is stored, transmitted, or recorded, it later may be retried and processed so as to restore the compressed data to its original form. For example, at block 514, the compressed may be retrieved from the data recorder 420, the mass storage device 424, or received by the data transceiver 422 and decompressed at block 520. The decompressed data at block 528 is rearranged at block 536 in accordance with one embodiment of the present invention. The re-arranged frame/subframe representation of data at block 538 can then be analyzed at block 524.

While several embodiments of the invention have been described, it should be apparent, however, that various modifications, alterations and adaptations to those embodiments may occur to persons skilled in the art with the attainment of some or all of the advantages of the present invention. It is therefore intended to cover all such modifications, alterations and adaptation without departing from the scope and spirit of the present invention as defined by the appended claims.

What is claimed is:

1. A method of processing a data file, the method comprising:

selecting a packet size that is a number of bits between one and a subframe size within an input file containing data stored in frames and subframes format, wherein the data file is stored in a computer memory in digital form;

separating the data into consecutive packets of the selected size;

repositioning the packets located in similar positions within a frame adjacent to one another; and storing the packets in an output file.

2. The method of claim 1, further comprising processing the output file by a compression algorithm.

3. The method of claim 1, further comprising parsing the input file for determining the subframe size.

4. The method of claim 1, wherein the subframe comprises a plurality of words.

5. The method of claim 4, wherein the subframe comprises any one of 2, 4, 8, 16, 32, 64, 128, 256, 384, 512, 1024, 2048 words.

6. The method of claim 5, wherein the plurality of words in the subframe comprise any one of 2, 4, 8, 12, 16, and 32 bits.

7. The method of claim 1, wherein the frame comprises a plurality of subframes.

8. The method of claim 7, wherein the frame comprises four subframes.

9. A method of processing a compressed data file, the method comprising:
    decompressing a compressed data file stored in a computer memory in digital form, the compressed data file containing a predetermined packet size identifier, repositioned packets located in similar positions within a frame adjacent to one another, and separated consecutive packets of the predetermined packet size, wherein the predetermined packet size is between one and a subframe size;
    repositioning the adjacent consecutive packets of the predetermined size into an original position within the frame; and
    storing the decompressed repositioned frames in an output file.

10. The method of claim 9, wherein the subframe comprises a plurality of words.

11. The method of claim 10, wherein the subframe comprises any one of 2, 4, 8, 16, 32, 64, 128, 256, 384, 512, 1024, 2048 words.

12. The method of claim 11, wherein the plurality of bits in the subframe comprise any one of 1, 2, 4, 8, 12, 16, and 32 bits.

13. The method of claim 9, wherein the frame comprises a plurality of subframes.

14. The method of claim 13, wherein the frame comprises four subframes.

15. A method of processing a data file, the method comprising:
    selecting a number of frames to be processed within the data file containing data stored in frames and subframes format, wherein the data file is stored in a computer memory in digital form, and wherein the number of frames are selected according to an available amount of memory in the computer;
    creating an output file to store the processed data;
    selecting a packet size that is a number of bits between one and a subframe size;
    separating the data into consecutive packets of the selected size;
    repositioning the packets located in similar positions within a frame adjacent to one another;
    appending the processed packets to the output file;
    repeating the selecting, separating, repositioning, and appending steps for the number of selected frames;
    processing a remaining portion of the input file containing less than the selected number of frames; and
    storing the output file for further processing by a compression algorithm.

16. The method of claim 15, further comprising parsing the input file to determine the subframe size.

17. The method of claim 15, wherein the subframe comprises a plurality of words.

18. The method of claim 17, wherein the subframe comprises any one of 1, 2, 4, 8, 16, 32, 64, 128, 256, 384, 512, 1024, and 2048 words.

19. The method of claim 18, wherein the plurality of bits in the subframe comprise any one of 1, 2, 4, 8, 12, 16, and 32 bits.

20. The method of claim 15, wherein the frame comprises a plurality of subframes.

21. The method of claim 20, wherein the frame comprises four subframes.

22. A method of processing a compressed data file, the method comprising:
    decompressing a selected portion of the compressed data file stored in a computer memory in digital form, the compressed data file containing a predetermined packet size identifier, repositioned packets located in similar positions within a frame adjacent to one another, and separated consecutive packets of the predetermined packet size, wherein the predetermined packet size is a number of bits between one and a subframe size;
    repositioning the adjacent consecutive packets of the predetermined size into an original position within the frame;
    repeating the decompressing and the repositioning steps until all portions of the compressed file of the selected size are decompressed;
    decompressing a portion of the compressed data file of less than the selected size; and
    storing the decompressed repositioned frames in an output file.

23. A system for processing a data file, the system comprising:
    a processor for selecting a packet size that is a number of bits between one and a subframe size within the data file containing data stored in frames and subframes format, wherein the data file is stored in a computer memory in digital form; separating the data into consecutive packets of the selected size; and repositioning the packets located in similar positions within a frame adjacent to one another; and
    a memory for storing the packets in an output file.

24. The system of claim 23, wherein the output file is further processed by a compression algorithm.

25. A system for processing a compressed data file, the system comprising:
    a processor for decompressing the compressed data file stored in a computer memory in digital form, the compressed data file containing a predetermined packet size identifier, repositioned packets located in similar positions within a frame adjacent to one another, and separated consecutive packets of the predetermined packet size, wherein the predetermined packet size is a number of bits between one and a subframe size; repositioning the adjacent consecutive packets of the predetermined size into an original position within the frame; and
    a memory for storing the decompressed repositioned frames in an output file.

26. A system for processing a data file stored in a computer memory in digital form, comprising:
    a processor for:
        selecting a number of frames to be processed within an input file containing data stored in frames and subframes format, wherein the data file is stored in a computer memory in digital form, and wherein the number of frames is selected according to an available amount of memory in the computer;
        creating an output file to store the processed data;

selecting a packet size that is a number of bits between one and a subframe size;

separating the data into consecutive packets of the selected size;

repositioning the packets located in similar positions within a frame adjacent to one another;

appending the processed packets to the output file;

repeating the selecting, separating, repositioning, and appending steps for the number of selected frames; and processing a remaining portion of the input file containing less than the selected number of frames; and a memory for storing the output file for further processing by a compression algorithm.

27. A system for processing a data file stored in a computer memory in digital form, comprising:

a processor for:

decompressing a selected portion of a compressed data file stored in a computer memory in digital form, the compressed data file containing a predetermined packet size identifier, repositioned packets located in similar positions within a frame adjacent to one another, and separated consecutive packets of the predetermined packet size, wherein the predetermined packet size is a number of bits between one and a subframe size;

repositioning the adjacent consecutive packets of the predetermined size into its original position within the frame;

repeating the decompressing, repositioning, and repeating steps until all portions of the compressed file of the selected size are decompressed; and decompressing a portion of the compressed data file of less than the selected size; and a memory for storing the decompressed repositioned frames in an output file.

28. A computer-readable medium comprising computer executable instructions thereon for:

selecting a packet size that is a number of bits between one and a subframe size within an input file containing data stored in frames and subframes format, wherein the data file is stored in a computer memory in digital form;

separating the data into consecutive packets of the selected size;

repositioning the packets located in similar positions within a frame adjacent to one another; and storing the packets in an output file for further processing by a compression algorithm.

29. A computer-readable medium comprising computer executable instructions thereon for:

decompressing a compressed data file stored in a computer memory in digital form, the compressed data file containing a predetermined packet size identifier, repositioned packets located in similar positions within a frame adjacent to one another, and separated consecutive packets of the predetermined packet size, wherein the predetermined packet size is a number of bits between one and a subframe size;

repositioning the adjacent consecutive packets of the predetermined size into its original position within the frame; and storing the decompressed repositioned frames in an output file.

30. A computer-readable medium comprising computer executable instructions thereon for:

selecting a number of frames to be processed within an input file containing data stored in frames and subframes format, wherein the data file is stored in a computer memory in digital form, and wherein the number of frames is selected according to an available amount of memory in the computer;

creating an output file to store the processed data;

selecting a packet size that is a number of bits between one and a subframe size;

separating the data into consecutive packets of the selected size;

repositioning the packets located in similar positions within a frame adjacent to one another;

appending the processed packets to the output file;

repeating the selecting, separating, repositioning, and appending steps for the number of selected frames;

processing a remaining portion of the input file containing less than the selected number of frames; and storing the output file for further processing by a compression algorithm.

31. A computer-readable medium comprising computer executable instructions thereon for:

decompressing a selected portion of a compressed data file stored in a computer memory in digital form, the compressed data file containing a predetermined packet size identifier, repositioned packets located in similar positions within a frame adjacent to one another, and separated consecutive packets of the predetermined packet size, wherein the predetermined packet size is a number of bits between one and a subframe size;

repositioning the adjacent consecutive packets of the predetermined size into its original position within the frame;

repeating the decompressing and repositioning steps until all portions of the compressed file of the selected size are decompressed;

decompressing a portion of the compressed data file of less than the selected size; and storing the decompressed repositioned frames in an output file.

32. A system for processing a data file stored in a computer memory in digital form, comprising:

means for selecting a packet size that is a number of bits between one and a subframe size within an input file containing data stored in frames and subframes format, wherein the data file is stored in a computer memory in digital form; separating the data into consecutive packets of the selected size; and repositioning the packets located in similar positions within a frame adjacent to one another; and means for storing the packets in an output file.

33. A system for processing a data file stored in a computer memory in digital form, comprising:

means for decompressing compressed data file stored in a computer memory in digital form, the compressed data file containing a predetermined packet size identifier, repositioned packets located in similar positions within a frame adjacent to one another, and separated consecutive packets of the predetermined packet size, wherein the predetermined packet size is a number of bits between one and a subframe size; repositioning the adjacent consecutive packets of the predetermined size into its original position within the frame; and means for storing the decompressed repositioned frames in an output file.

* * * * *

UNITED STATES PATENT AND TRADEMARK OFFICE
CERTIFICATE OF CORRECTION

PATENT NO. : 6,654,386 B2
DATED : November 25, 2003
INVENTOR(S) : Nahapetian et al.

It is certified that error appears in the above-identified patent and that said Letters Patent is hereby corrected as shown below:

Column 9,
Line 18, delete "10A" and substitute -- 110A -- therefor.
Line 43, after "are" insert -- not --.

Column 10,
Line 32, delete "retried" and substitute -- retrieved -- therefor.
Line 35, after "compressed" insert -- data --.
Line 39, delete "re-arranged" and substitute -- rearranged -- therefor.
Line 48, delete "adaptation" and substitute -- adaptations -- therefor.

Signed and Sealed this

Twenty-fourth Day of May, 2005

JON W. DUDAS
*Director of the United States Patent and Trademark Office*